US008638131B2

(12) United States Patent
Chen et al.

(10) Patent No.: US 8,638,131 B2
(45) Date of Patent: Jan. 28, 2014

(54) DYNAMIC FEEDBACK-CONTROLLED OUTPUT DRIVER WITH MINIMUM SLEW RATE VARIATION FROM PROCESS, TEMPERATURE AND SUPPLY

(75) Inventors: Wilson J. Chen, San Diego, CA (US); Chiew-Guan Tan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 13/032,808

(22) Filed: Feb. 23, 2011

(65) Prior Publication Data

US 2012/0212260 A1 Aug. 23, 2012

(51) Int. Cl.
*H03K 3/00* (2006.01)
(52) U.S. Cl.
USPC ............................................. 327/108; 327/170
(58) Field of Classification Search
USPC ..................................... 327/108, 170
See application file for complete search history.

(56) References Cited

U.S. PATENT DOCUMENTS

| | | | | | |
|---|---|---|---|---|---|
| 4,857,863 | A | * | 8/1989 | Ganger et al. | 330/264 |
| 5,051,625 | A | * | 9/1991 | Ikeda et al. | 326/27 |
| 5,587,678 | A | * | 12/1996 | Dijkmans | 327/108 |
| 5,745,012 | A | * | 4/1998 | Oka et al. | 331/68 |
| 5,748,019 | A | * | 5/1998 | Wong et al. | 327/170 |
| 5,786,734 | A | * | 7/1998 | Park | 331/57 |
| 5,949,259 | A | * | 9/1999 | Garcia | 327/111 |
| 5,973,512 | A | * | 10/1999 | Baker | 326/87 |
| 5,982,246 | A | * | 11/1999 | Hofhine et al. | 331/116 FE |
| 6,040,744 | A | * | 3/2000 | Sakurai et al. | 331/176 |
| 6,147,550 | A | * | 11/2000 | Holloway | 327/544 |
| 6,167,240 | A | | 12/2000 | Carlsson et al. | |
| 6,359,869 | B1 | | 3/2002 | Sonetaka | |
| 6,504,830 | B1 | | 1/2003 | Ostberg et al. | |
| 6,556,094 | B2 | | 4/2003 | Hasegawa et al. | |

(Continued)

FOREIGN PATENT DOCUMENTS

EP 1811711 A1 7/2007
EP 2076066 7/2009

(Continued)

OTHER PUBLICATIONS

3GPP: "3rd Generation Partnership Project; Technical Specification Group Radio Access Network; Evolved Universal Terrestria Radio Access (E-UTRA); Physical 1 ayer procedures (Re1 ease 8)" 3GPP TS 36.213 V8.7.0 (May 2009) Technical Specification, No. V8.7.0, Jun. 8, 2009, pp. 1-77, XP002602609.

(Continued)

*Primary Examiner* — Kenneth B. Wells
(74) *Attorney, Agent, or Firm* — Sam Talpalatsky; Nicholas J. Pauley; Joseph Agusta

(57) ABSTRACT

In examples, apparatus and methods are provided that mitigate buffer slew rate variations due to variations in output capacitive loading, a fabrication process, a voltage, and/or a temperature (PVT). An exemplary embodiment includes an inverting buffer having an input and an output, as well as an active resistance series-coupled with a capacitor between the input and the output. The resistance of the active resistance varies based on a variation in a fabrication process, a voltage, and/or temperature. The active resistance can be a passgate. In another example, a CMOS inverter's output is coupled to the input of the inverting buffer, and two series-coupled inverting buffers are coupled between the input of the CMOS inverter and the output of the inverting buffer.

40 Claims, 6 Drawing Sheets

(56) References Cited

U.S. PATENT DOCUMENTS

| | | | |
|---|---|---|---|
| 6,653,878 B2 | 11/2003 | Nolan | |
| 6,677,799 B1 | 1/2004 | Brewer | |
| 6,724,813 B1 | 4/2004 | Jamal et al. | |
| 6,734,747 B1* | 5/2004 | Ishikawa et al. | 331/158 |
| 6,819,168 B1* | 11/2004 | Brewer | 327/560 |
| 6,819,195 B1* | 11/2004 | Blanchard et al. | 331/173 |
| 7,019,551 B1 | 3/2006 | Biesterfeldt | |
| 7,129,798 B2* | 10/2006 | Aoyama et al. | 331/135 |
| 7,142,059 B2* | 11/2006 | Klein et al. | 330/292 |
| 7,420,395 B2* | 9/2008 | Kuramasu | 326/83 |
| 7,652,533 B2* | 1/2010 | Wang et al. | 330/253 |
| 7,710,212 B2* | 5/2010 | Seliverstov | 331/183 |
| 7,786,779 B2 | 8/2010 | Chang et al. | |
| 7,795,902 B1 | 9/2010 | Yella | |
| 7,817,666 B2 | 10/2010 | Spinar et al. | |
| 7,843,886 B2 | 11/2010 | Johnson et al. | |
| 7,859,314 B2* | 12/2010 | Rutkowski et al. | 327/108 |
| 7,924,066 B2* | 4/2011 | Gagne et al. | 327/108 |
| 7,940,740 B2 | 5/2011 | Krishnamurthy et al. | |
| 8,010,151 B2 | 8/2011 | Kim et al. | |
| 8,058,928 B2* | 11/2011 | Terzioglu | 330/107 |
| 8,077,670 B2 | 12/2011 | Fan et al. | |
| 8,085,875 B2 | 12/2011 | Gore et al. | |
| 2005/0064873 A1 | 3/2005 | Karaoguz et al. | |
| 2005/0096061 A1 | 5/2005 | Ji et al. | |
| 2005/0254555 A1 | 11/2005 | Teague et al. | |
| 2005/0260990 A1 | 11/2005 | Huang et al. | |
| 2006/0166693 A1 | 7/2006 | Jeong et al. | |
| 2007/0153719 A1 | 7/2007 | Gopal | |
| 2007/0167181 A1 | 7/2007 | Ramesh et al. | |
| 2007/0242763 A1 | 10/2007 | Li et al. | |
| 2007/0253355 A1 | 11/2007 | Hande et al. | |
| 2008/0008212 A1 | 1/2008 | Wang et al. | |
| 2008/0056193 A1 | 3/2008 | Bourlas et al. | |
| 2008/0075032 A1 | 3/2008 | Balachandran et al. | |
| 2008/0106297 A1 | 5/2008 | Jao | |
| 2008/0130588 A1 | 6/2008 | Jeong et al. | |
| 2008/0205322 A1 | 8/2008 | Cai et al. | |
| 2008/0212514 A1 | 9/2008 | Chen | |
| 2008/0227449 A1 | 9/2008 | Gholmieh et al. | |
| 2008/0253300 A1 | 10/2008 | Wakabayashi et al. | |
| 2008/0260000 A1 | 10/2008 | Periyalwar et al. | |
| 2008/0268859 A1 | 10/2008 | Lee et al. | |
| 2009/0069023 A1 | 3/2009 | Ahn et al. | |
| 2009/0109915 A1 | 4/2009 | Pasad et al. | |
| 2009/0135769 A1 | 5/2009 | Sambhwani et al. | |
| 2009/0196165 A1 | 8/2009 | Morimoto et al. | |
| 2009/0196250 A1 | 8/2009 | Feng et al. | |
| 2009/0197631 A1 | 8/2009 | Palanki et al. | |
| 2009/0201880 A1 | 8/2009 | Aghili et al. | |
| 2009/0238117 A1 | 9/2009 | Somasundaram et al. | |
| 2009/0252077 A1 | 10/2009 | Khandekar et al. | |
| 2009/0257371 A1 | 10/2009 | Nishio | |
| 2009/0257390 A1 | 10/2009 | Ji et al. | |
| 2009/0264077 A1 | 10/2009 | Damnjanovic | |
| 2009/0268684 A1 | 10/2009 | Lott et al. | |
| 2009/0274086 A1 | 11/2009 | Petrovic et al. | |
| 2009/0312024 A1 | 12/2009 | Chen et al. | |
| 2009/0325626 A1 | 12/2009 | Palanki et al. | |
| 2010/0008282 A1 | 1/2010 | Bhattad et al. | |
| 2010/0022250 A1 | 1/2010 | Petrovic et al. | |
| 2010/0029282 A1 | 2/2010 | Stamoulis et al. | |
| 2010/0034158 A1 | 2/2010 | Meylan | |
| 2010/0035600 A1 | 2/2010 | Hou et al. | |
| 2010/0069076 A1 | 3/2010 | Ishii et al. | |
| 2010/0080154 A1 | 4/2010 | Noh et al. | |
| 2010/0091919 A1 | 4/2010 | Xu et al. | |
| 2010/0110964 A1 | 5/2010 | Love et al. | |
| 2010/0144317 A1 | 6/2010 | Jung et al. | |
| 2010/0232373 A1 | 9/2010 | Nory et al. | |
| 2010/0240386 A1 | 9/2010 | Hamabe et al. | |
| 2010/0246521 A1 | 9/2010 | Zhang et al. | |
| 2010/0254268 A1 | 10/2010 | Kim et al. | |
| 2010/0254329 A1 | 10/2010 | Pan et al. | |
| 2010/0254344 A1 | 10/2010 | Wei et al. | |
| 2010/0272059 A1 | 10/2010 | Bienas et al. | |
| 2010/0290372 A1 | 11/2010 | Zhong et al. | |
| 2010/0304665 A1 | 12/2010 | Higuchi | |
| 2010/0309803 A1 | 12/2010 | Toh et al. | |
| 2010/0309867 A1 | 12/2010 | Palanki et al. | |
| 2010/0309876 A1 | 12/2010 | Khandekar et al. | |
| 2010/0323611 A1 | 12/2010 | Choudhury | |
| 2011/0007673 A1 | 1/2011 | Ahn et al. | |
| 2011/0013554 A1 | 1/2011 | Koskinen | |
| 2011/0038271 A1 | 2/2011 | Shin et al. | |
| 2011/0044227 A1 | 2/2011 | Harrang et al. | |
| 2011/0053603 A1 | 3/2011 | Luo et al. | |
| 2011/0064037 A1 | 3/2011 | Wei et al. | |
| 2011/0116364 A1 | 5/2011 | Zhang et al. | |
| 2011/0149771 A1 | 6/2011 | Abeta et al. | |
| 2011/0170503 A1 | 7/2011 | Chun et al. | |
| 2011/0182245 A1 | 7/2011 | Malkamaki et al. | |
| 2011/0188481 A1 | 8/2011 | Damnjanovic et al. | |
| 2011/0190024 A1 | 8/2011 | Seong et al. | |
| 2011/0201279 A1 | 8/2011 | Suzuki et al. | |
| 2011/0205982 A1 | 8/2011 | Yoo et al. | |
| 2011/0211503 A1 | 9/2011 | Che et al. | |
| 2011/0243075 A1 | 10/2011 | Luo et al. | |
| 2011/0249643 A1 | 10/2011 | Barbieri et al. | |
| 2011/0275394 A1 | 11/2011 | Song et al. | |
| 2011/0310830 A1 | 12/2011 | Wu et al. | |
| 2011/0317624 A1 | 12/2011 | Luo et al. | |
| 2012/0033588 A1 | 2/2012 | Chung et al. | |
| 2012/0033647 A1 | 2/2012 | Moon et al. | |
| 2012/0087250 A1 | 4/2012 | Song et al. | |
| 2012/0088516 A1 | 4/2012 | Ji et al. | |
| 2012/0093095 A1 | 4/2012 | Barbieri et al. | |
| 2012/0093097 A1 | 4/2012 | Che et al. | |
| 2012/0106481 A1 | 5/2012 | Cho et al. | |
| 2012/0108239 A1 | 5/2012 | Damnjanovic et al. | |
| 2012/0182958 A1 | 7/2012 | Pelletier et al. | |
| 2012/0236798 A1 | 9/2012 | Raaf et al. | |
| 2012/0281656 A1 | 11/2012 | Hooli et al. | |
| 2013/0005344 A1 | 1/2013 | Dimou et al. | |
| 2013/0077543 A1 | 3/2013 | Kim et al. | |
| 2013/0229933 A1 | 9/2013 | Ji et al. | |
| 2013/0250927 A1 | 9/2013 | Song | |

FOREIGN PATENT DOCUMENTS

| | | |
|---|---|---|
| JP | H06350514 A | 12/1994 |
| JP | 09501038 | 1/1997 |
| JP | 09327060 A | 12/1997 |
| JP | H1118144 A | 1/1999 |
| JP | 2006345405 A | 12/2006 |
| JP | 2007529915 A | 10/2007 |
| JP | 2008301493 A | 12/2008 |
| JP | 2009527939 A | 7/2009 |
| JP | 2010506446 A | 2/2010 |
| JP | 2010081446 A | 4/2010 |
| JP | 2010519784 A | 6/2010 |
| JP | 2010541492 A | 12/2010 |
| JP | 2011507391 A | 3/2011 |
| JP | 2011521512 | 7/2011 |
| RU | 2007105748 A | 8/2008 |
| WO | 2005019705 A1 | 3/2005 |
| WO | 2005062798 A2 | 7/2005 |
| WO | WO2005109705 | 11/2005 |
| WO | 2006020021 A1 | 2/2006 |
| WO | 2007080892 A1 | 7/2007 |
| WO | WO2007097671 A1 | 8/2007 |
| WO | WO2007108630 A1 | 9/2007 |
| WO | 2007129620 A1 | 11/2007 |
| WO | 2008040448 A1 | 4/2008 |
| WO | 2008041819 A2 | 4/2008 |
| WO | 2008057969 | 5/2008 |
| WO | 2008081816 A1 | 7/2008 |
| WO | 2008086517 | 7/2008 |
| WO | 2009011059 A1 | 1/2009 |
| WO | WO2009016260 A1 | 2/2009 |
| WO | WO2009022295 | 2/2009 |
| WO | WO2009038367 | 3/2009 |
| WO | 2009046061 A2 | 4/2009 |
| WO | WO2009043002 | 4/2009 |

(56) References Cited

FOREIGN PATENT DOCUMENTS

| WO | WO2009062115 | 5/2009 |
| WO | WO2009064147 A2 | 5/2009 |
| WO | WO2009065075 A1 | 5/2009 |
| WO | 2009071583 A1 | 6/2009 |
| WO | WO2009078795 A1 | 6/2009 |
| WO | 2009089798 A1 | 7/2009 |
| WO | WO2009088251 A2 | 7/2009 |
| WO | WO2009096846 A1 | 8/2009 |
| WO | 2009126586 A2 | 10/2009 |
| WO | WO2009152866 A1 | 12/2009 |
| WO | 2010006285 A2 | 1/2010 |
| WO | WO2010016726 A2 | 2/2010 |
| WO | WO2010033957 A2 | 3/2010 |
| WO | 2010110840 A2 | 9/2010 |
| WO | WO 2011034966 A1 | 3/2011 |

OTHER PUBLICATIONS

3GPP: "3rd Generation Partnership Project; Technical Specification Group Radio Access Network; Evolved Universal Terrestrial Radio Access (E-UTRA); Services provided by the physical layer (Release 8)", 3GPP Standard; 3GPP TS 36.302, 3rd Generation Partnership Project (3GPP), Mobile Competence Centre ; 650, Route Des Lucioles ; F-06921 Sophia-Antipolis Cedex ; France, No. V8.1.0, Mar. 1, 2009, pp. 1-17, XP050377589.

3GPP: "3rd Generation Partnership Project;Technical Specification Group Radio Access Network;Further Advancements for E-UTRAPhysical Layer Aspects(Release 9)", 3GPP Draft; TR 36.814_110, 3rd Generation Partnership Project (3GPP), Mobile Competence Centre ; 650, Route Des Lucioles ; F-06921 Sophia-Antipolis Cedex ; France, No. San Francisco, USA; May 9, 2009, pp. 1-34, XP050339706, [retrieved on May 9, 2009].

3rd Generation Partnership Project: "3rd Generation Partnership Project; Technical Specification Group Radio Access Network; Evolved Universal Terrestrial Radio Access (E-UTRA) Medium Access Control (MAC) protocol specification (Release 8); 3GPP TS 36.321 V8.5.0" 3GPP TS 36.321 V8.5.0,, [Online] vol. 36.321, No. V8.5.0, Mar. 1, 2009, pp. 1-46, XP002555765 Internet Retrieved from the Internet: URL:http://www.3gpp.org/ftp/Specs/html-inf 0/36321,htm> [retrieved on Oct. 21, 2009] Sections 5.1.1 to 5.1.6.

3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 8) 3GPP Standard; 3GPP TS 36.300, 3rd Generation Partnership Project (3GPP), Mobile Competence Centre; 650, Route Des Lucioles; F-06921 Sophia-Antipolis Cedex; France, No. V8.8.0, Mar. 1, 2009, pp. 1-157, XP050377583, p. 45, line 3—p. 50, line 15.

Ericsson: 3GPP Draft; R3-083577, 3rd Generation Partnership Project (3GPP), Mobile Competence Centre ; 650, Route Des Lucioles ; F-06921 Sophia-Antipolis Cedex ; France, No. Prague, Czech Republic; Nov. 25, 2008, XP050324756 [retrieved on Nov. 25, 2008]Section 10.1.5.1.

Ericsson: "Simultaneous reception of transport channels in the LTE", 3GPP Draft; 36302_CR0009_(Rel-8) R2-093578, 3rd Generation Partnership Project (3GPP), Mobile Competence Centre ; 650, Route Des Lucioles ; F-06921 Sophia-Antipolis Cedex ; France, No. San Francisco, USA; May 9, 2009, pp. 1-3, XP050340488, [retrieved on May 9, 2009].

Fujitsu, "An Efficient Reference Signal Design in LTE Advanced", 3GPP Draft; R1-090949, 3rd Generation Partnership Project (3GPP), Mobile Competence Centre, 650, Route Des Lucioles, F-06921 Sophia-Antipolis Cedex, France, No. Athens, Greece, 20090206, Feb. 6, 2009, XP050318788.

Gale et al., "Distributed discreate resource optimization in Heterogeneous networks". 2008, pp. 560-564, IEEE 04641670.

Huawei : "Enhanced ICIC for control channels to support Het.Net,", 3GPP TSG RAN WG1 meeting #61 R1-103126, May 14, 2010, pp. 1-8, XP002660456, Montreal , Canada Retrieved from the Internet : URL:http://ftp.3gpp.org/ftp/tsg-ran/WGI-RL1/TSGR1_61/Docs/ [retrieved on Sep. 30, 2011].

Huawei: "CQI Enhancement for Interference Varying Environments", 3GPP Draft; R1-101061 CQI Enhancement for Interference Varying Environments VER (Final), 3rd Generation Partnership Project (3GPP), Mobile Competence Centre ; 650, Route Des Lucioles ; F-06921 Sophia-Antipolis Cedex ; France, vol. RAN WGI, No. San Francisco, USA; 20100222, Feb. 16, 2010, XP050418632, [retrieved on Feb. 16, 2010].

Huawei: "Enhanced ICIC and Resource-Specific CQI Measurement", 3GPP Draft; R1-101981, 3rd Generation Partnership Project (3GPP), Mobile Competence Centre ; 650, Route Des Lucioles ; F-06921 Sophia-Antipolis Cedex ; France, vol. RAN WGI, No. Beijing, china; 20100412, Apr. 6, 2010, XP050419318, [retrieved on Apr. 6, 2010].

Huawei: "R-PDCCH Design" 3GPP Draft; R1-093042 R-PDCCH Design, 3rd Generation Partnership Project (3GPP), Mobile Competence Centre ; 650, Route Des Lucioles ; F-06921 Sophia-Antipolis Cedex ; France, No. Shenzhen, China; 20090818, Aug. 18, 2009, XP050351434 [retrieved on Aug. 18, 2009] p. 1, paragraph 1.

Inoue et al., "Space time transmit site diversity for OFDM multi base station system", 2002, pp. 30-34, IEEE 01045691.

Kulkarni P., et al.,"Radio Resource Management Considerations for LTE Femto Cells", ACM SIGCOMM Computer Communication Review, vol. 40, No. 1, Jan. 2010, pp. 26-30.

LG Electronics Inc: "MAC Random Access Response Extension" 3GPP Draft; R2-085237 MAC RAR Extension, 3rd Generation Partnership Project (3GPP), Mobile Competence Centre ; 650, Route Des Lucioles ; F-06921 Sophia-Antipolis Cedex ; France, No. Prague, Czech Republic; Sep. 23, 2008, XP050320136, [retrieved on Sep. 23, 2008] the whole document.

Panasonic: "PDCCH with cross component carrier assignment", 3GPP Draft; R1-093597(Update of R1-093464), 3rd Generation Partnership Project (3GPP). Mobile Competence Centre ; 650, Route Des Lucioles ; F-06921 Sophia-Antipolis Cedex ; France, No. Shenzhen, China; Aug. 24, 2009, XP050388168, [retrieved on Aug. 22, 2009].

Potevio: "Considerations on the Resource Indication of R-PDCCH" 3GPP Draft; R1-093443 Considerations on the Resource Indication of R-PDCCH, 3rd Generation Partnership Project (3GPP), Mobile Competence Centre ; 650, Route Des Lucioles ; F-06921 Sophia-Antipolis Cedex ; France, No. Shenzhen, China; Aug. 18, 2009, XP050351718 [retrieved on Aug. 18, 2009] p. 1, paragraph 1-paragraph 2.

Qualcomm Europe: "Carrier Aggregation in Heterogeneous Networks", 3GPP Draft; R1-092239, 3rd Generation Partnership Project (3GPP), Mobile Competence Centre; 650, Route Des Lucioles; F-06921 Sophia-Antipolis Cedex; France, No. San Francisco, USA; May 8, 2009, XP050339658, [retrieved on May 8, 2009].

Qualcomm Inc., "Introduction of time domain ICIC", R2-106943, 3GPP TSG-RAN WG2 Meeting #72, Jacksonville, US, Nov. 15-19, 2010, pp. 4.

Qualcomm Inc., "RRM/RLM resource restriction for time domain ICIC", R2-110698, 3GPP TSG-RAN WG2 Meeting #72-bis, Dublin, Ireland, Jan. 17-21, 2011, pp. 8.

Qualcomm Incorporated: "Extending Rel-8/9 ICIC into Rel-10", 3GPP Draft; R1-101505 Extending Rel-8-9 ICIC Into Rel-10, 3rd Generation Partnership Project (3GPP), Mobile Competence Centre ; 650, Route Des Lucioles ; F-06921 Sophia-Antipolis Cedex ; France, vol. RAN WG1, No. San Francisco, USA; 20100222, Feb. 16, 2010, XP050418951, [retrieved on Feb. 16, 2010].

Samsung: "Clarification on the parallel receptions for PDSCHs", 3GPP Draft; 36302_CR0010 (REL-8) R2-093579, 3rd Generation Partnership Project (3GPP), Mobile Competence Centre ; 650, Route Des Lucioles ; F-06921 Sophia-Antipolis Cedex ; France, No. San Francisco, USA; May 19, 2009, pp. 1-2, XP050340489, [retrieved on May 19, 2009].

Samsung: "Downlink Subframe Alignment in Type I Relay" 3GPP Draft; R1-093386 Downlink Subframe Alignment in Type I Relay, 3rd Generation Partnership Project (3GPP), Mobile Competence Centre ; 650, Route Les Lucioles ; F-06921 Sophia-Antipolis

(56) References Cited

OTHER PUBLICATIONS

Cedex ; France, No. Shenzhen, China; Aug. 19, 2009, XP050351683 [retrieved on Aug. 19, 2009] p. 1, paragraph 1.

Samsung: "Inbound mobility to H(e)NBs" 3GPP Draft; R2-093250_Inb0und Mobility to H(E)NBS-R4, 3rd Generation Partnership Project (3GPP), Mobile Competence Centre ; 650, Route Des Lucioles ; F-06921 Sophia-Antipolis Cedex ; France, No. San Francisco, USA; Apr. 28, 2009, XP050340933 [retrieved on Apr. 28, 2009] the whole document.

Vice Chairman: "Report of E-UTRA control plane session" 3GPP Draft; R2-082841-Chair-Report-RAN2-62-LTE-CP, 3rd Generation Partnership Project (3GPP), Mobile Competence Centre ; 650, Route Des Lucioles ; F-06921 Sophia-Antipolis Cedex ; France, vol. RAN WG2, No. Kansas City, USA; May 14, 2008, XP050140403 [retrieved on May 14, 2008].

Young Jin Sang, et al., "A Self-Organized Femtocell for IEEE 802.16e System", Global Telecommunications Conference, 2009, GLOBECOM 2009, IEEE, IEEE, Piscataway, NJ, USA, Nov. 30, 2009, pp. 1-5, XP031646102, ISBN: 978-1-4244-4148-8.

3GPP TS 36.331 V8.5.0, Radio Resource Control (RRC); Protocol specification (Release 8), 204 pages, 2009.

Ericsson: "Structure of System Information", TSGR2#4(99)414, 5 pages, May 1999.

Garcia F., et al.,"Design of a slew rate controlled output buffer", ASIC Conference 1998. Proceedings. Eleventh Annual IEEE International Rochester, NY, USA Sep. 13-16, 1998, New York, NY, USA.IEEE, US, Sep. 13, 1998, pp. 147-150, XP010309693, DOI: 10.1109/ASIC.1998.722821 ISBN: 978-0-7803-4980-3.

International Search Report and Written Opinion—PCT/US2012/026303—ISA/EPO—Nov. 30, 2012.

Alcatel-Lucent Shanghai Bell et al., "Multi-cell cooperative RS in CoMP", 3GPP Draft; R1-092317, 3rd Generation Partnership Project (3GPP), Mobile Competence Centre; 650, Route Des Lucioles; F-06921 Sophia-Antipolis Cedex; France, No. Los Angeles, USA; Jun. 24, 2009, XP050350848, [retrieved on Jun. 24, 2009].

Huawei: "Discussion on OTDOA based positioning issue"; 3GPP Draft; R1-092355, 3rd Generation Partnership Project (3GPP), Mobile Competence Centre; 650, Route Des Lucioles; F-06921 Sophia-Antipolis Cedex; France, No. Los Angeles; USA, Jun. 24, 2009; XP050350879, [retrieved on Jun. 24, 2009-06-24].

Qualcomm Europe: "DL Carrier Aggregation Performance in Heterogeneous Networks", [online], 3GPP TSG-RAN WG1#58, R1-093145, URL: http://www.3gpp.org/ftp/tsg_ran/WG1_RL1/TSGR1_58/Docs/R1-093145.zip.

Gaie C., et al., Distributed discrete resource optimization in heterogeneous networks, Signal Processing Advances in Wireless Communications, 2008. SPAWC 2008. IEEE 9th Workshop on, pp. 560 to 564, 2008. Row 9 of col. 2 of p. 2 and Paragraph 1 of col. 1 of p. 1.

Taiwan Search Report—TW099131274—TIPO—Jul. 19, 2013.

\* cited by examiner

DYNAMIC FEEDBACK-CONTROLLED OUTPUT DRIVER WITH MINIMUM SLEW RATE VARIATION FROM PROCESS, TEMPERATURE AND SUPPLY

FIELD OF DISCLOSURE

This application relates generally to electronic devices and more specifically, but not exclusively, to improving buffer performance.

BACKGROUND

Semiconductor production is becoming less centralized as new foundries are being established across the globe. Some effects of the establishment of new foundries include increasing variations in the fabrication process (i.e., large-scale chip-to-chip variations) and/or increasing local variations in the fabrication process (i.e., small-scale intrachip variations). As an example of a global variation, a buffer in an integrated circuit fabricated by one foundry has a different slew rate than the same type of buffer in the same type of integrated circuit that has been fabricated at a different foundry. As an example of a local variation, two buffers on the same die, having constituent components with ideally identical dimensions, can have different slew rates due to variations in doping.

Capacitive loading of the buffer's output can also vary a buffer's slew rate, as changes in the buffer's output voltage vary the voltage stored by the capacitive portion of the load. Charging and discharging the capacitive portion of the load takes time, and thus the charge/discharge time varies accordingby the capacitance portion. Also, when the buffer is designed to be coupled to standards-compatible hot-swappable devices or devices having changing capacitive loads, the buffer circuit designer may not know exactly what capacitive load the buffer will encounter, and thus cannot optimize the buffer's slew rate for the unknown capacitive load. In addition to variations in capacitive loading, buffer supply voltage and temperature variations also vary a buffer's slew rate.

As a result of fabrication process, voltage, and temperature (PVT) variations and capacitive loading of the buffer's output, a slew rate of a conventional buffer varies too much for some applications. When the conventional buffer's output slew rate is controlled with a conventional feedback circuit having only a capacitor coupled between the buffer's output and input, the slew rate variations can be mitigated somewhat, but only marginally. In addition, the effectiveness of the conventional feedback circuit varies based on PVT variations, which can drive the output slew rate variation even higher. The slew rate variations in turn change the rail-to-rail rise times and fall times such that the rail-to-rail rise times and fall times vary too much for some applications.

FIGS. 1 and 2 depict conventional output I/O buffer structures 100, 200 with conventional output slew rate control. In FIGS. 1 and 2, a Miller's capacitor ($C_{fb}$) 105 is placed between the input node 110 and output node 115 of a basic in/out output buffer 120. As the output slew rate varies across the amount of output capacitive load ($C_{load}$) 125, $C_{fb}$ 105 also starts charging/discharging the input node 110 of the output buffer 120 accordingly, and thus controls the output slew rate of the output buffer 120. With just a simple feedback capacitor $C_{fb}$ 105, the output buffer 120 is able to achieve some degree of reduction in its output slew rate across different $C_{load}$ 125, but the slew rate is still subject to full PVT variations, which add a very significant amount of output slew variation to the design.

There are long-felt industry needs for buffer circuits that mitigate the effects of performance variations. Thus, there are needs to address the aforementioned issues by improving upon classic circuit designs and methods.

SUMMARY

Exemplary embodiments of the invention are directed to systems and methods for improving buffer performance. For example, the exemplary embodiments described hereby provide, among other advantages, that buffer output slew rate is much less sensitive to the variations of output capacitive loads, processes, voltage supplies, and temperature. The exemplary embodiments address the long-felt needs in the industry described herein.

In an example, a buffer circuit is provided. The buffer circuit includes an inverting buffer having an input and an output, as well as an active resistance series-coupled with a capacitor between the input and the output. The resistance of the active resistance varies based on a variation in at least one of fabrication process or temperature. The active resistance can be a passgate. The buffer circuit can include a CMOS inverter having an output, with the CMOS inverter output coupled to the input of the inverting buffer, and can also include two series-coupled inverting buffers coupled between the input of the CMOS inverter and the output of the inverting buffer. The output of the inverting buffer can be coupled to a digital, serial, two-wire, inter-chip media bus. The buffer circuit can be integrated in a semiconductor die, and can be integrated into a device, such as a set top box, music player, video player, entertainment unit, navigation device, communications device, personal digital assistant (PDA), fixed location data unit, and/or a computer.

In another exemplary embodiment, a method for reducing slew rate variations in a buffer circuit having an inverting buffer with the inverting buffer output coupled to the inverting buffer input via a capacitor series-coupled with an active resistance is provided. A portion of an output voltage is fed back from the inverting buffer output to the inverting buffer input via the capacitor and the active resistance. The portion of the output voltage, with the active resistance, is varied, based on a variation in at least one of fabrication process or temperature. When a CMOS buffer has an output coupled to the input of the inverting buffer, an input to the inverting buffer is buffered. When a capacitive load is coupled to the inverting buffer output, the inverting buffer is prevented from turning on, based on the capacitance of the capacitive load.

In a further exemplary embodiment, provided is a buffer circuit including an inverting buffer, as well as means for feeding a portion of an output voltage from the inverting buffer output to the inverting buffer input via a capacitor series-coupled with an active resistance. The buffer circuit also includes means for varying the portion of the output voltage, with the active resistance, based on a variation in at least one of process or temperature.

Also provided is an exemplary embodiment of a non-transitory computer-readable medium, comprising instructions stored thereon that, if executed by a lithographic device, cause the lithographic device to fabricate at least a part of a device. The device includes an inverting buffer having an input and an output; and an active resistance series-coupled with a capacitor between the input and the output. The resistance of the active resistance varies exponentially for a variation in at least one of fabrication process and temperature. The non-transitory computer-readable medium can further include instructions stored thereon that, if executed by the lithographic device, cause the lithographic device to fabricate a passgate as the active resistance.

In another example, a buffer circuit is provided. The buffer circuit includes an inverting buffer having an input and an output, as well as an active resistance series-coupled with a capacitor between the input and the output. The resistance of the active resistance varies based on a variation in power supply voltage. The active resistance can be a passgate. The buffer circuit can include a CMOS inverter having an output, with the CMOS inverter output coupled to the input of the inverting buffer, and can also include two series-coupled inverting buffers coupled between the input of the CMOS inverter and the output of the inverting buffer. The output of the inverting buffer can be coupled to a digital, serial, two-wire, inter-chip media bus. The buffer circuit can be integrated in a semiconductor die, and can be integrated into a device, such as a set top box, music player, video player, entertainment unit, navigation device, communications device, personal digital assistant (PDA), fixed location data unit, and/or a computer.

In another exemplary embodiment, a method for reducing slew rate variations in a buffer circuit having an inverting buffer with the inverting buffer output coupled to the inverting buffer input via a capacitor series-coupled with an active resistance is provided. A portion of an output voltage is fed back from the inverting buffer output to the inverting buffer input via the capacitor and the active resistance. The portion of the output voltage, with the active resistance, is varied, based a variation in power supply voltage. When a CMOS buffer has an output coupled to the input of the inverting buffer, an input to the inverting buffer is buffered. When a capacitive load is coupled to the inverting buffer output, the inverting buffer is prevented from turning on, based on the capacitance of the capacitive load.

In a further exemplary embodiment, provided is a buffer circuit including an inverting buffer, as well as means for feeding a portion of an output voltage from the inverting buffer output to the inverting buffer input via a capacitor series-coupled with an active resistance. The buffer circuit also includes means for varying the portion of the output voltage, with the active resistance, based on a variation in power supply voltage.

Also provided is an exemplary embodiment of a non-transitory computer-readable medium, comprising instructions stored thereon that, if executed by a lithographic device, cause the lithographic device to fabricate at least a part of a device. The device includes an inverting buffer having an input and an output, and an active resistance series-coupled with a capacitor between the input and the output. The resistance of the active resistance varies exponentially for a variation in power supply voltage. The non-transitory computer-readable medium can further include instructions stored thereon that, if executed by the lithographic device, cause the lithographic device to fabricate a passgate as the active resistance.

The foregoing has broadly outlined the features and technical advantages of the present teachings in order that the detailed description that follows may be better understood. Additional features and advantages are described herein, which form the subject of the claims. The conception and specific embodiments disclosed can be readily utilized as a basis for modifying or designing other structures for carrying out the same purposes of the present teachings. Such equivalent constructions do not depart from the technology of the teachings as set forth in the appended claims. The novel features which are believed to be characteristic of the teachings, both as to its organization and method of operation, together with further objects and advantages are better understood from the following description when considered in connection with the accompanying figures. Each of the figures is provided for the purpose of illustration and description only, and do not define limits of the present teachings.

BRIEF DESCRIPTION OF THE DRAWINGS

The accompanying drawings are presented to describe examples of the present teachings, and are not provided as limitations.

Figure 2:
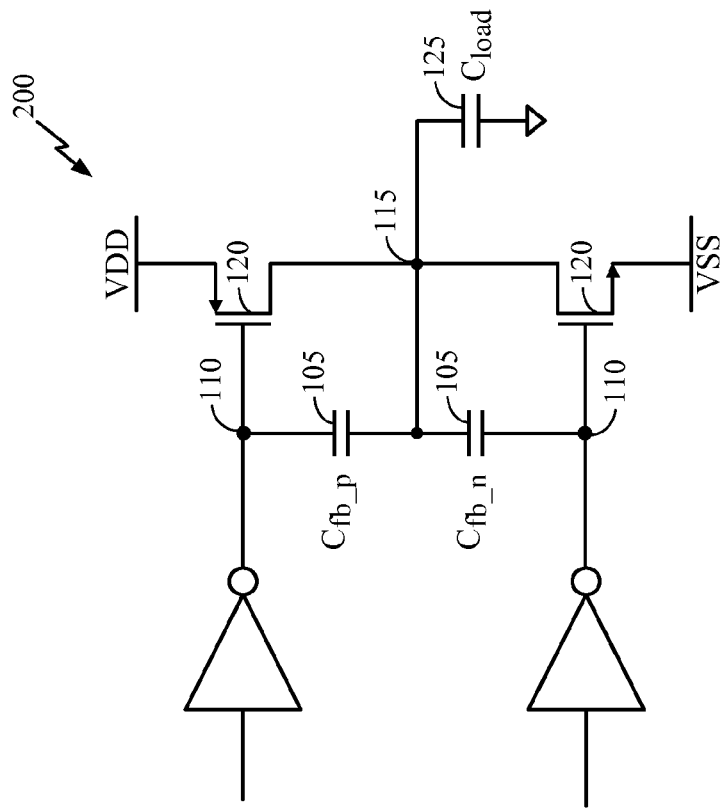
FIG. 2 depicts another conventional output buffer with output slew rate control.
Figure 1:
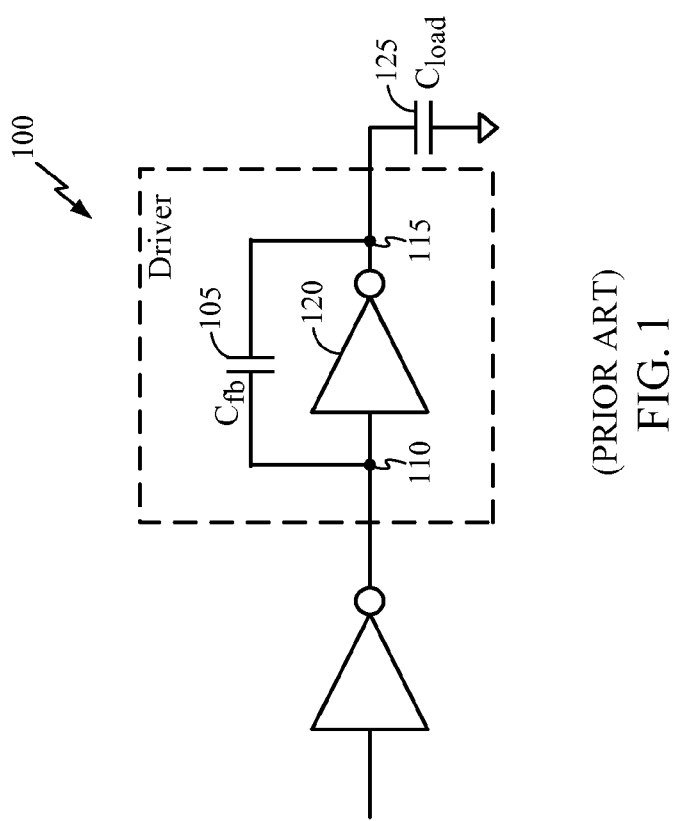
FIG. 1 depicts a conventional output buffer with output slew rate control.

In accordance with common practice, the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Aspects of the invention are disclosed in the following description and related drawings directed to specific embodiments of the invention. Alternate embodiments can be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation. Also, the terms buffer and driver are used interchangeably herein.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, commands, information, signals, bits, symbols, and chips that can be referenced throughout this description can be represented by voltages, currents, electromagnetic waves, magnetic fields or particles, optical fields or particles, or any combination thereof It should be understood that any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. Also, unless stated otherwise a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof Further, many embodiments are described in terms of sequences of actions to be performed by, for example, elements of a computing and/or lithographic device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored thereon a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Introduction

In exemplary embodiments, provided are systems and methods for buffer circuits that self-correct slew rate variations due to variations in output capacitive loading, fabrication processes, voltages, and temperature (PVT). For example, a buffer circuit includes a feedback path coupled between a buffer input and a buffer output. The feedback path includes an active resistance, such as a passgate, coupled in series with a capacitor. As at least one of capacitive loading, fabrication processes, voltages, and/or temperature vary, the resistance of the active resistance also varies to mitigate a change in slew rate. For example, as output capacitive loading increases, the slew rate should decrease as the rise and fall times increase. Under these circumstances the resistance of the active resistance decreases to mitigate the increase in rise and fall times, which mitigates the decrease in slew rate.

DESCRIPTION OF THE FIGURES

Figure 3:
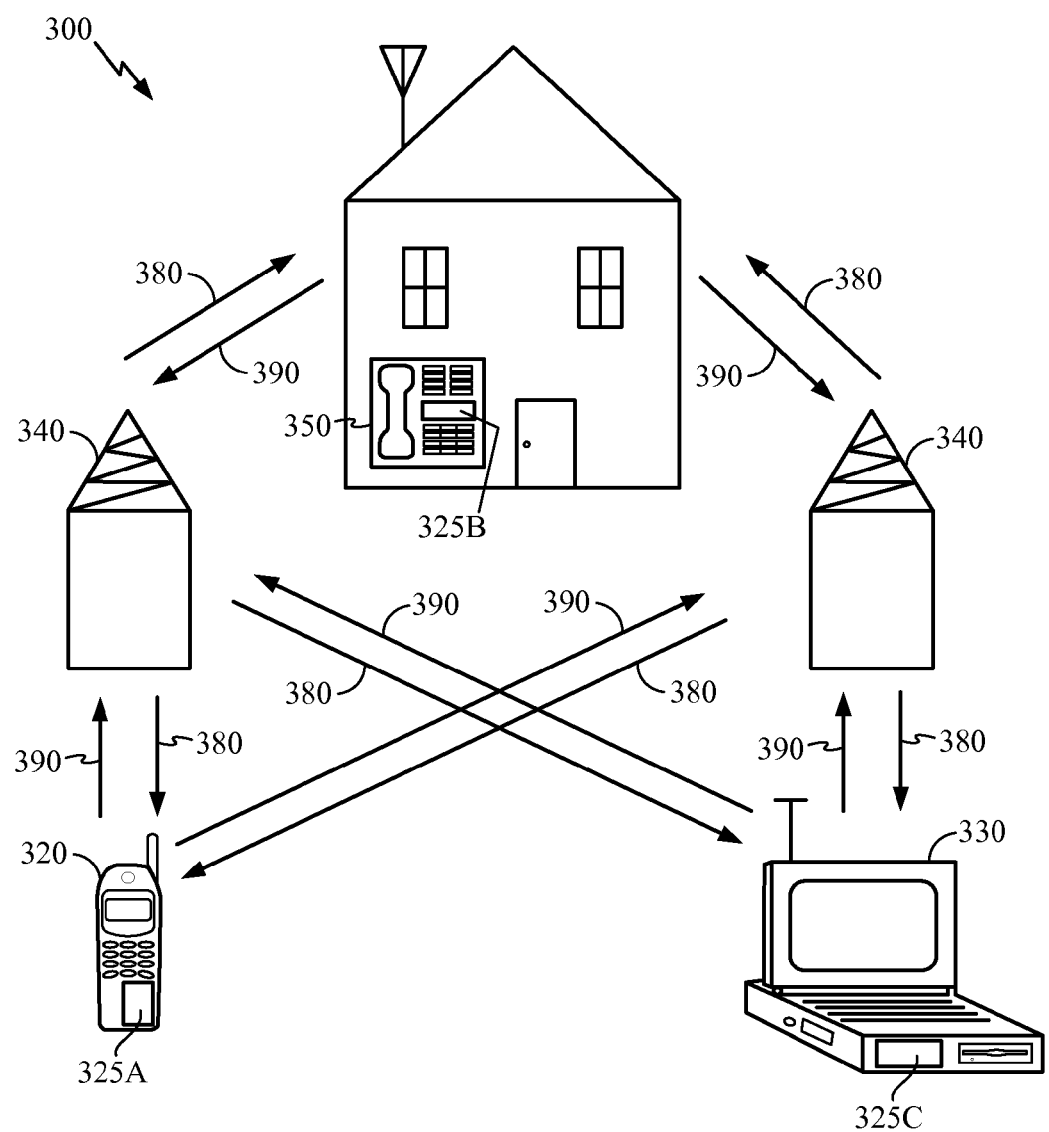
FIG. 3 depicts an exemplary communication device.

FIG. 3 depicts an exemplary communication system 300 in which an embodiment of the disclosure can be advantageously employed. For purposes of illustration, FIG. 3 shows three remote units 320, 330, and 350 and two base stations 340. It will be recognized that conventional wireless communication systems can have many more remote units and base stations. The remote units 320, 330, and 350 include at least a part of an embodiment 325A-C of the disclosure as discussed further below. FIG. 3 shows forward link signals 380 from the base stations 340 and the remote units 320, 330, and 350, as well as reverse link signals 390 from the remote units 320, 330, and 350 to the base stations 340.

In FIG. 3, the remote unit 320 is shown as a mobile telephone, the remote unit 330 is shown as a portable computer, and the remote unit 350 is shown as a fixed location remote unit in a wireless local loop system. For example, the remote units can be mobile phones, hand-held personal communication systems (PCS) units, portable data units such as personal data assistants, navigation devices (such as GPS enabled devices), set top boxes, music players, video players, entertainment units, fixed location data units (e.g., meter reading equipment), or any other device that stores or retrieves data or computer instructions, or any combination thereof Although FIG. 3 illustrates remote units according to the teachings of the disclosure, the disclosure is not limited to these exemplary illustrated units. Embodiments of the disclosure can be suitably employed in any device.

Figure 4:
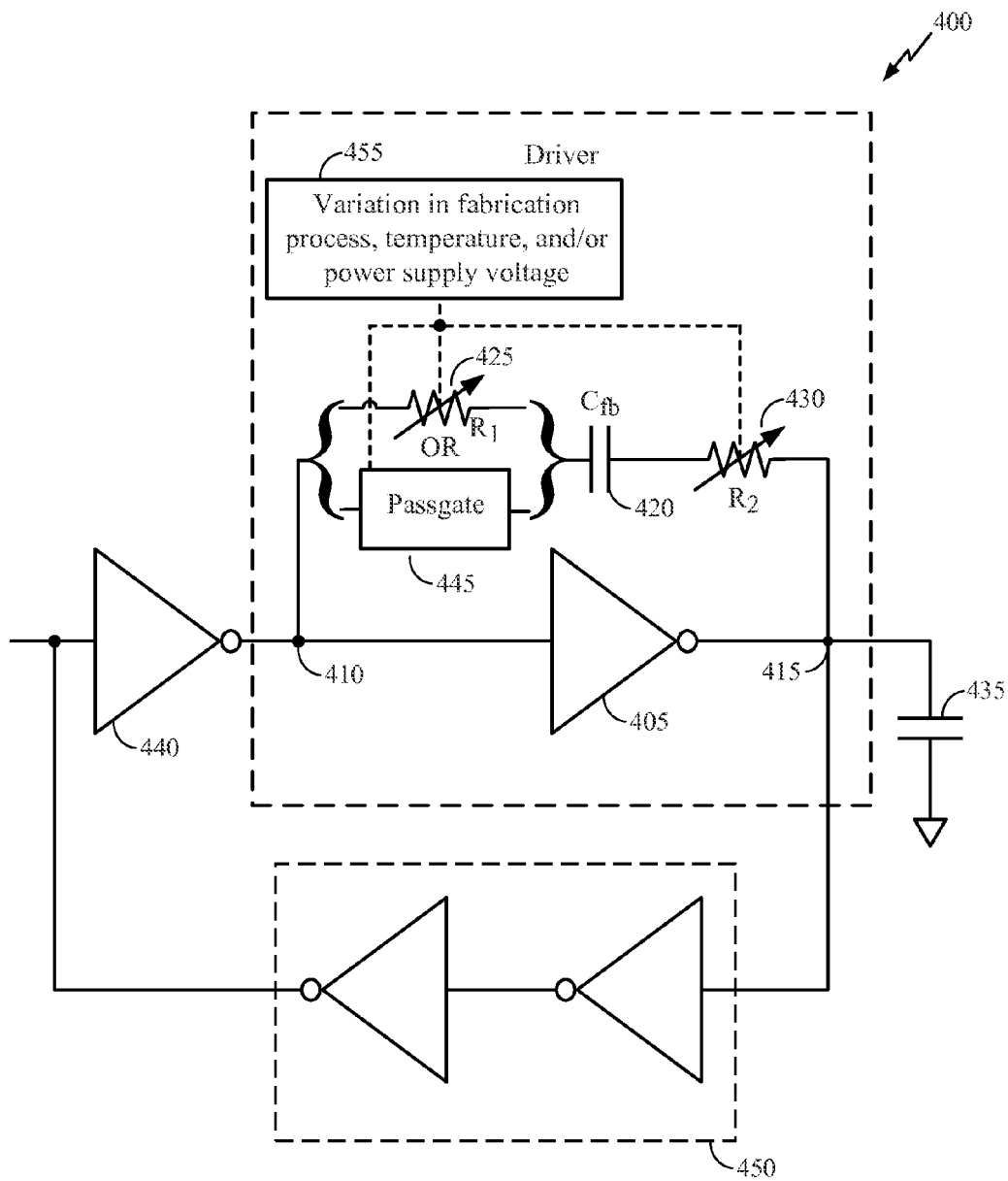
FIG. 4 depicts an exemplary buffer circuit with slew rate control.

FIG. 4 depicts an exemplary buffer circuit 400 with slew rate control, according to an embodiment. The buffer circuit 400 has an inverting buffer 405 with an input 410 and an output 415. The buffer circuit 400 has a feedback capacitor ($C_{fb}$) 420 coupled in series with a first resistance (R1) 425 and a second resistance (R2) 430 between the input 410 and output 415. The output 415 of the buffer circuit 400 is coupled to a capacitive load 435. A second inverting buffer 440, such as a CMOS buffer, can be coupled to the input 410 of the inverting buffer 405. In an example, a single resistance can replace the first resistance (R1) 425 and the second resistance (R2) 430.

The resistances R1 425 and R2 430 in the capacitive feedback path reduce the buffer's output slew rate in response to process and temperature variations. When the inverting buffer 405 is too fast, such as at a fast (FF) corner and/or a low temperature, the resistance of R1 425 and R2 430 is reduced. This enhances the effective capacitance of the feedback path. Conversely, when the inverting buffer 405 is too slow, such as at a slow (SS) corner and/or a high temperature, the resistance of R1 425 and R2 430 is increased. This speeds up the output driver to increase slew rate. Maximum variation reduction occurs when R1 425 and R2 430 are active devices, and when resistance variations of R1 425 and R2 430 due to changes in PVT are the greatest. A passgate 445 is an example of an active resistance that can be used as R1 425 and/or R2 430. A transistor biased to operate in the linear region is another example of an active resistance that can be used as R1 425 and/or R2 430. The buffer circuit 400 can also include two series-coupled inverting buffers 450 coupled between the input of the second inverting buffer 440 and the output 415 of the inverting buffer 405. The resistances R1 425 and R2 430, as well as the optional passgate 445 are controlled based on a variation 455 in at least one of fabrication process, temperature, and/or a power supply voltage.

Figure 5:
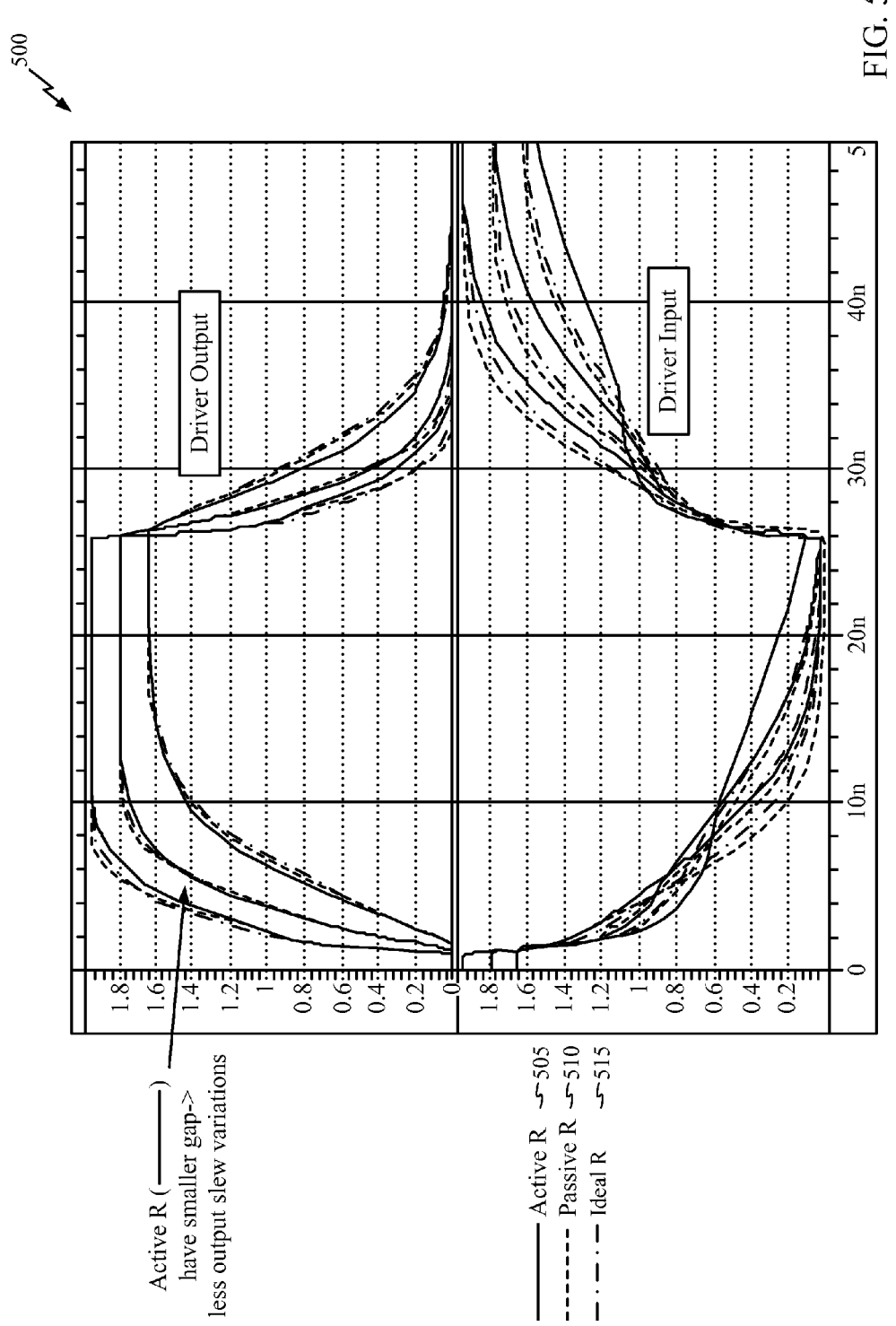
FIG. 5 depicts exemplary input and output wave forms of the exemplary buffer circuit of FIG. 4.

FIG. 5 depicts input and output waveforms 500 of the inverting buffer 405, and demonstrates advantages of having the resistances R1 425 and R2 430 in the feedback path. In FIG. 5, performance results of three variations of the buffer circuit 400 are provided. A first circuit has ideal resistors (Ideal R) 505, a second circuit has p-poly passive resistors (Passive R) 510, and a third circuit has an active resistance (Active R) 515, in the form of a passgate, as resistances R1 425 and R2 430 in the feedback path. FIG. 5 depicts performance results for each exemplary circuit under three sets of conditions.

In the first set of conditions, the maximum slew rate is obtained. In the first set of conditions, the power supply voltage is 1.95V, the process corner is fast (FF), the temperature is −30 C, and the capacitive load 435 has a capacitance of 15 pF. In the second set of conditions, a typical slew rate is obtained. In the second set of conditions, the power supply voltage is 1.8V, the process corner (TT) is typical, the temperature is 25 C, and the capacitive load 435 has a capacitance of 40 pF. In the third set of conditions, the minimum slew rate is obtained. In the third set of conditions, the power supply voltage is 1.65V, the process corner is slow (SS), the temperature is 125 C, and the capacitive load 435 has a capacitance of 75 pF. The resultant slew rates are shown in Table 1:

TABLE 1

| | Rising Slew (V/ns) | | | | Falling Slew (V/ns) | | | |
|---|---|---|---|---|---|---|---|---|
| | Min | Typ | Max | Δ% | Min | Typ | Max | Δ% |
| Ideal R | 0.167 | 0.285 | 0.442 | 96.5% | 0.164 | 0.286 | 0.447 | 99% |
| Passive R (p-poly) | 0.168 | 0.283 | 0.417 | 88% | 0.165 | 0.284 | 0.420 | 89.8% |
| Active R (passgate) | 0.185 | 0.286 | 0.358 | 60.5% | 0.183 | 0.286 | 0.355 | 60.1% |

In Table 1, the differential percentage (Δ%) is determined by the equation: Δ% =(Max−Min)/Typ×100%. A percentage of slew rate variation reduction by the third circuit having an active resistance, versus the first circuit having ideal resistors, is shown in Table 2:

TABLE 2

| | % Reduction (Rising) | % Reduction (Falling) |
|---|---|---|
| Passive R (p-poly) | 8.5% | 9.2% |
| Active R (passgate) | 36% | 38.9% |

In Table 2, the percentage reduction is determined by the equation: % of Reduction=Δ%(Ideal R)−Δ%. When comparing the first circuit having the ideal resistor to the second and third circuits, the circuit having the passive resistor has more than an 8% reduction in output slew rate variation, while the second and third circuits show more than a 36% reduction in output slew rate variation.

Figure 6:
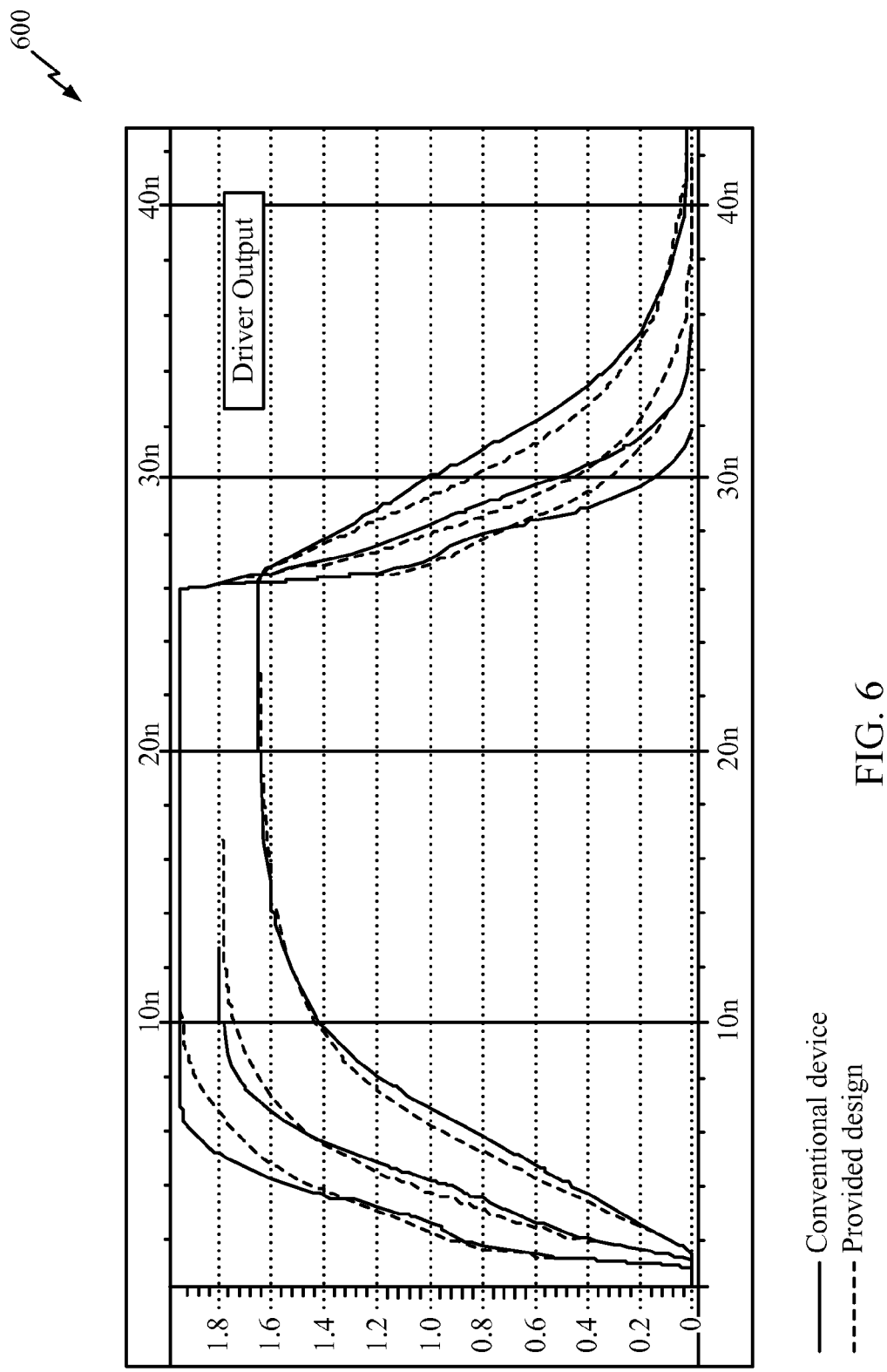
FIG. 6 depicts an output slew rate simulation result comparison between a conventional device and an exemplary buffer circuit.

FIG. 6 depicts an output slew rate simulation result comparison 600 between a conventional device and an exemplary embodiment. Comparison data is shown in Table 3:

TABLE 3

| | Rising Slew (V/ns) | | | | Falling Slew (V/ns) | | | |
|---|---|---|---|---|---|---|---|---|
| | Min | Typ | Max | Δ% | Min | Typ | Max | Δ% |
| Conventional Device | 0.171 | 0.281 | 0.416 | 87.2% | 0.169 | 0.284 | 0.424 | 89.8% |
| Exemplary Embodiment | 0.185 | 0.286 | 0.358 | 60.5% | 0.183 | 0.286 | 0.355 | 60.1% |

As can be seen in Table 3, and the output waveforms depicted in FIG. 6, the exemplary embodiment reduces slew rate variations by at least 27% over the conventional device.

Figure 7:
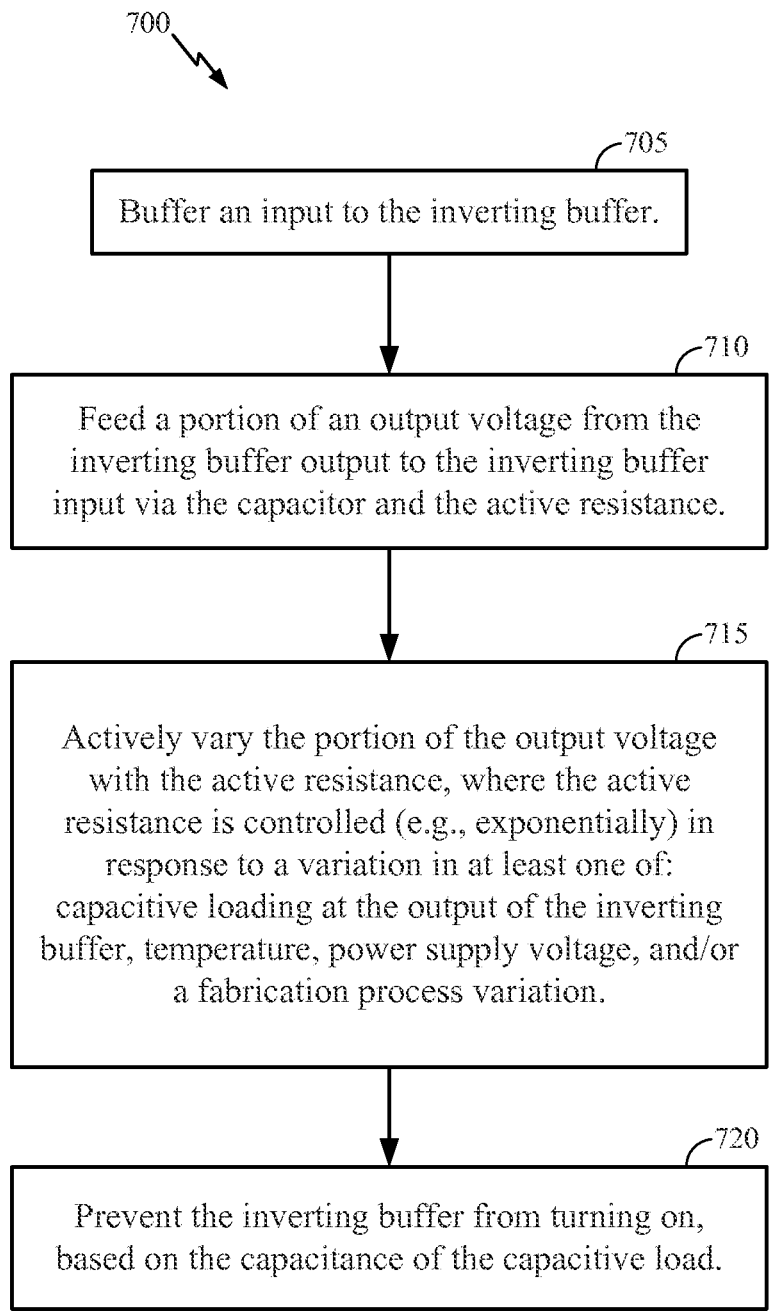
FIG. 7 is a flowchart of a method for reducing slew rate variations in a buffer circuit.

FIG. 7 is a flowchart of a method 700 for reducing slew rate variations in a buffer circuit having an inverting buffer, with the inverting buffer output coupled to the inverting buffer input via a capacitor series-coupled with an active resistance.

In optional step 705, an input to the inverting buffer is buffered.

In step 710, a portion of an output voltage is fed from the inverting buffer output to the inverting buffer input via the capacitor and the active resistance.

In step 715, the portion of the output voltage is varied with the active resistance, where the active resistance is controlled based on a variation in at least one of: capacitive loading at the output of the inverting buffer, fabrication process, temperature, and/or a power supply voltage. The resistance of the active resistance can vary exponentially for a variation in power supply voltage.

In step 720, the inverting buffer is prevented from turning on, based on the capacitance of the capacitive load.

CONCLUSION

Those of skill in the art will appreciate that the various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described herein. Accordingly, at least a portion of the devices described herein can be integrated in at least one semiconductor die.

Accordingly, embodiments can include machine-readable media or computer-readable media embodying instructions which, when executed by a processor, transform the processor and any other cooperating devices into a machine for fabricating at least a part of the apparatus described hereby.

The teachings herein can be incorporated into various types of communication systems and/or system components. In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM.R™., etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies.

The teachings herein can be integrated into a device, selected from the group consisting of a set top box, music player, video player, entertainment unit, navigation device, communications device, personal digital assistant (PDA), fixed location data unit, and a computer.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of: A, B, or C" used in the description or the claims can mean "A or B or C or any combination of these elements."

Nothing that has been stated or illustrated is intended to cause a dedication of any component, step, feature, object, benefit, advantage, or equivalent to the public, regardless of whether it is recited in the claims.

While this disclosure shows exemplary embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order.

What is claimed is:

1. A buffer circuit, comprising:
   an inverting buffer having an input and an output; and
   an active resistance series-coupled with a capacitor between the input and the output,
   wherein the active resistance is a passgate configured to provide feedback from the output of the inverting buffer to the input of the inverting buffer and to mitigate a slew rate variation by actively changing resistance in response to a variation in a fabrication process, and the passgate is configured to provide the resistance in an exponential manner in response to the variation in the fabrication process.

2. The buffer circuit of claim 1, further comprising a CMOS inverter having an output, with the CMOS inverter output coupled to the input of the inverting buffer.

3. The buffer circuit of claim 1, wherein output of the inverting buffer is coupled to a digital, serial, two-wire, inter-chip media bus.

4. The buffer circuit of claim 1, wherein the buffer circuit is integrated on a semiconductor die.

5. The buffer circuit of claim 1, further comprising a device, selected from the group consisting of a set top box, music player, video player, entertainment unit, navigation device, communications device, personal digital assistant (PDA), fixed location data unit, and a computer, into which the buffer circuit is integrated.

6. The buffer circuit of claim 1, wherein the passgate is not a part of the inverting buffer.

7. A method for reducing slew rate variations in a buffer circuit having an inverting buffer with the inverting buffer output coupled to the inverting buffer input via a capacitor series-coupled with a passgate configured to provide feedback from the output of the inverting buffer to the input of the inverting buffer and to mitigate the slew rate variations by actively changing resistance in response to a variation in a fabrication process, comprising:
   feeding a portion of an output voltage from the inverting buffer output to the inverting buffer input via the capacitor and the passgate; and
   varying the portion of the output voltage to mitigate the slew rate variations, by actively changing the resistance of the passgate, in response to a variation in a fabrication process,
   wherein resistance of the passgate varies exponentially in response to the variation in the fabrication process.

8. The method of claim 7, wherein a CMOS buffer has an output coupled to the input of the inverting buffer, further comprising:
   buffering an input to the inverting buffer.

9. A buffer circuit, comprising:
   an inverting buffer;
   means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a fabrication process; and means for varying the portion of the output voltage, using the passgate, in response to the variation in the fabrication process,
wherein the passgate is configured to provide the resistance in an exponential manner in response to the variation in the fabrication process.

10. A non-transitory computer-readable medium, comprising instructions stored thereon that, if executed by a lithographic device, cause the lithographic device to fabricate at least a part of a device, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively varying the resistance in response to a variation in fabrication process, and the resistance of the passgate is configured to vary exponentially in response to the variation in the fabrication process.

11. A buffer circuit, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively changing resistance in response to a variation in power supply voltage, and the passgate is configured to provide the resistance in an exponential manner in response to the variation in the power supply voltage.

12. The buffer circuit of claim 11, further comprising a CMOS inverter having an output, with the CMOS inverter output coupled to the input of the inverting buffer.

13. The buffer circuit of claim 11, wherein output of the inverting buffer is coupled to a digital, serial, two-wire, interchip media bus.

14. The buffer circuit of claim 11, wherein the buffer circuit is integrated on a semiconductor die.

15. The buffer circuit of claim 11, further comprising a device, selected from the group consisting of a set top box, music player, video player, entertainment unit, navigation device, communications device, personal digital assistant (PDA), fixed location data unit, and a computer, into which the buffer circuit is integrated.

16. A method for reducing slew rate variations in a buffer circuit having an inverting buffer with the inverting buffer output coupled to the inverting buffer input via a capacitor series-coupled with a passgate configured to provide feedback from the output of the inverting buffer to the input of the inverting buffer and to mitigate the slew rate variations by actively changing resistance in response to a variation in a power supply voltage, comprising:
feeding a portion of an output voltage from the inverting buffer output to the inverting buffer input via the capacitor and the passgate; and
varying the portion of the output voltage to mitigate the slew rate variations, by actively changing the resistance of the passgate, in response to the variation in the power supply voltage,
wherein the resistance of the passgate varies exponentially in response to the variation in the power supply voltage.

17. The method of claim 16, further comprising:
buffering an input to the inverting buffer.

18. A buffer circuit, comprising:
an inverting buffer;
means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a power supply voltage; and
means for varying the portion of the output voltage, using the passgate, in response to the variation in the power supply voltage,
wherein the passgate is configured to provide the resistance in an exponential manner in response to the variation in the power supply voltage.

19. A non-transitory computer-readable medium, comprising instructions stored thereon that, if executed by a lithographic device, cause the lithographic device to fabricate at least a part of a device, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively varying the resistance in response to a variation in power supply voltage, and the resistance of the passgate is configured to vary exponentially in response to the variation in the power supply voltage.

20. A buffer circuit, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively changing resistance in response to a variation in temperature, and the passgate is configured to provide the resistance in an exponential manner in response to the variation in the temperature.

21. The buffer circuit of claim 20, further comprising a CMOS inverter having an output, with the CMOS inverter output coupled to the input of the inverting buffer.

22. The buffer circuit of claim 20, wherein output of the inverting buffer is coupled to a digital, serial, two-wire, interchip media bus.

23. The buffer circuit of claim 20, wherein the buffer circuit is integrated on a semiconductor die.

24. The buffer circuit of claim 20, further comprising a device, selected from the group consisting of a set top box, music player, video player, entertainment unit, navigation device, communications device, personal digital assistant (PDA), fixed location data unit, and a computer, into which the buffer circuit is integrated.

25. A method for reducing slew rate variations in a buffer circuit having an inverting buffer with the inverting buffer output coupled to the inverting buffer input via a capacitor series-coupled with a passgate configured to provide feedback from the output of the inverting buffer to the input of the inverting buffer and to mitigate the slew rate variations by actively changing resistance in response to a variation in temperature, comprising:
feeding a portion of an output voltage from the inverting buffer output to the inverting buffer input via the capacitor and the passgate; and varying the portion of the output voltage to mitigate the slew rate variations, by actively changing the resistance of the passgate, in response to the variation in the temperature, wherein the resistance of the passgate varies exponentially in response to the variation in the temperature.

26. The method of claim 25, wherein a CMOS buffer has output coupled to the input of the inverting buffer, further comprising:

buffering an input to the inverting buffer.

27. A buffer circuit, comprising:

an inverting buffer;

means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a temperature; and means for varying the portion of the output voltage, using the passgate, in response to the variation in the temperature wherein the passgate is configured to provide the resistance in an exponential manner in response to the variation in the temperature.

28. A non-transitory computer-readable medium, comprising instructions stored thereon that, if executed by a lithographic device, cause the lithographic device to fabricate at least a part of a device, comprising:

an inverting buffer having an input and an output; and an active resistance series-coupled with a capacitor between the input and the output, wherein the active resistance is a passgate configured to provide feedback from the output of the inverting buffer to the input of the inverting buffer and to mitigate a slew rate variation by actively varying the resistance in response to the a variation in temperature, and the resistance of the passgate is configured to vary exponentially in response to the variation in the temperature.

29. A buffer circuit, comprising:

an inverting buffer having an input and an output;

an active resistance series-coupled with a capacitor between the input and the output, wherein the active resistance is a passgate configured to provide feedback from the output of the inverting buffer to the input of the inverting buffer and to mitigate a slew rate variation by actively changing resistance in response to a variation in a fabrication process;

a CMOS inverter having an output, with the CMOS inverter output coupled to the input of the inverting buffer; and two series-coupled inverting buffers coupled between the input of the CMOS inverter and the output of the inverting buffer.

30. A buffer circuit, comprising:

an inverting buffer;

means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a fabrication process;

means for varying the portion of the output voltage, using the passgate, in response to the variation in the fabrication process;

a CMOS inverter having an output, with the CMOS inverter output coupled to the input of the inverting buffer; and two series-coupled inverting buffers coupled between the input of the CMOS inverter and the output of the inverting buffer.

31. A non-transitory computer-readable medium, comprising instructions stored thereon that, if executed by a lithographic device, cause the lithographic device to fabricate at least a part of a device, comprising:

an inverting buffer having an input and an output;

an active resistance series-coupled with a capacitor between the input and the output, wherein the active resistance is a passgate configured to provide feedback from the output of the inverting buffer to the input of the inverting buffer and to mitigate a slew rate variation by actively varying the resistance in response to a variation in fabrication process;

a CMOS inverter having an output, with the CMOS inverter output coupled to the input of the inverting buffer; and two series-coupled inverting buffers coupled between the input of the CMOS inverter and the output of the inverting buffer.

32. A buffer circuit, comprising:

an inverting buffer having an input and an output;

an active resistance series-coupled with a capacitor between the input and the output, wherein the active resistance is a passgate configured to provide feedback from the output of the inverting buffer to the input of the inverting buffer and to mitigate a slew rate variation by actively changing resistance in response to a variation in power supply voltage;

a CMOS inverter having an output, with the CMOS inverter output coupled to the input of the inverting buffer; and two series-coupled inverting buffers coupled between the input of the CMOS inverter and the output of the inverting buffer.

33. A buffer circuit, comprising:

an inverting buffer;

means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a power supply voltage;

means for varying the portion of the output voltage, using the passgate, in response to the variation in the power supply voltage;

a CMOS inverter having an output, with the CMOS inverter output coupled to the input of the inverting buffer; and two series-coupled inverting buffers coupled between the input of the CMOS inverter and the output of the inverting buffer.

34. A non-transitory computer-readable medium, comprising instructions stored thereon that, if executed by a lithographic device, cause the lithographic device to fabricate at least a part of a device, comprising:

an inverting buffer having an input and an output;

an active resistance series-coupled with a capacitor between the input and the output, wherein the active resistance is a passgate configured to provide feedback from the output of the inverting buffer to the input of the inverting buffer and to mitigate a slew rate variation by actively varying the resistance in response to a variation in power supply voltage;
a CMOS inverter having an output, with the CMOS inverter output coupled to the input of the inverting buffer; and
two series-coupled inverting buffers coupled between the input of the CMOS inverter and the output of the inverting buffer.

35. A buffer circuit, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively changing resistance in response to a variation in temperature;
a CMOS inverter having an output, with the CMOS inverter output coupled to the input of the inverting buffer; and
two series-coupled inverting buffers coupled between the input of the CMOS inverter and the output of the inverting buffer.

36. A buffer circuit, comprising:
an inverting buffer;
means for feeding a portion of an output voltage from the inverting buffer output to the inverting buffer input using a capacitor series-coupled with a passgate configured to provide feedback from the output of the inverting buffer to the input of the inverting buffer and to mitigate a slew rate variation by actively changing resistance in response to a variation in a temperature;
means for varying the portion of the output voltage, using the passgate, in response to the variation in the temperature;
a CMOS inverter having an output, with the CMOS inverter output coupled to the input of the inverting buffer; and
two series-coupled inverting buffers coupled between the input of the CMOS inverter and the output of the inverting buffer.

37. A non-transitory computer-readable medium, comprising instructions stored thereon that, if executed by a lithographic device, cause the lithographic device to fabricate at least a part of a device, comprising:
an inverting buffer having an input and an output; and
an active resistance series-coupled with a capacitor between the input and the output,
wherein the active resistance is a passgate configured to provide feedback from the output of the inverting buffer to the input of the inverting buffer and to mitigate a slew rate variation by actively varying the resistance in response to the a variation in temperature;
a CMOS inverter having an output, with the CMOS inverter output coupled to the input of the inverting buffer; and
two series-coupled inverting buffers coupled between the input of the CMOS inverter and the output of the inverting buffer.

38. A method for reducing slew rate variations in a buffer circuit having an inverting buffer with the inverting buffer output coupled to a capacitive load and to the inverting buffer input via a capacitor series-coupled with a passgate configured to provide feedback from the output of the inverting buffer to the input of the inverting buffer and to mitigate the slew rate variations by actively changing resistance in response to a variation in a fabrication process, comprising:
feeding a portion of an output voltage from the inverting buffer output to the inverting buffer input via the capacitor and the passgate;
varying the portion of the output voltage to mitigate the slew rate variations, by actively changing the resistance of the passgate, in response to a variation in a fabrication process; and
preventing the inverting buffer from turning on, based on the capacitance of the capacitive load.

39. A method for reducing slew rate variations in a buffer circuit having an inverting buffer with the inverting buffer output coupled to a capacitive load and to the inverting buffer input via a capacitor series-coupled with a passgate configured to provide feedback from the output of the inverting buffer to the input of the inverting buffer and to mitigate the slew rate variations by actively changing resistance in response to a variation in a power supply voltage, comprising:
feeding a portion of an output voltage from the inverting buffer output to the inverting buffer input via the capacitor and the passgate;
varying the portion of the output voltage to mitigate the e slew rate variations, by actively changing the resistance of the passgate, in response to the variation in the power supply voltage; and
preventing the inverting buffer from turning on, based on the capacitance of the capacitive load.

40. A method for reducing slew rate variations in a buffer circuit having an inverting buffer with the inverting buffer output coupled to a capacitive load and to the inverting buffer input via a capacitor series-coupled with a passgate configured to provide feedback from the output of the inverting buffer to the input of the inverting buffer and to mitigate the slew rate variations by actively changing resistance in response to a variation in temperature, comprising:
feeding a portion of an output voltage from the inverting buffer output to the inverting buffer input via the capacitor and the passgate; and
varying the portion of the output voltage to mitigate the slew rate variations, by actively changing the resistance of the passgate, in response to the variation in the temperature; and
preventing the inverting buffer from turning on, based on the capacitance of the capacitive load.

* * * * *